(12) United States Patent
Chin et al.

(10) Patent No.: US 10,251,261 B2
(45) Date of Patent: Apr. 2, 2019

(54) CIRCUIT STRUCTURE

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Tou Chin, Mie (JP); Arinobu Nakamura, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/061,349

(22) PCT Filed: Jan. 25, 2017

(86) PCT No.: PCT/JP2017/002580
§ 371 (c)(1),
(2) Date: Jun. 12, 2018

(87) PCT Pub. No.: WO2017/131044
PCT Pub. Date: Aug. 3, 2017

(65) Prior Publication Data
US 2018/0368249 A1 Dec. 20, 2018

(30) Foreign Application Priority Data

Jan. 27, 2016 (JP) ................................ 2016-013689

(51) Int. Cl.
*H05K 1/11* (2006.01)
*H05K 1/02* (2006.01)
(Continued)

(52) U.S. Cl.
CPC ............. *H05K 1/028* (2013.01); *B60R 16/02* (2013.01); *H05K 1/181* (2013.01);
(Continued)

(58) Field of Classification Search
CPC ................... H05K 1/028; H05K 1/181; H05K 2201/10053; H05K 2201/10166; H05K 2201/10272; B60R 16/02
(Continued)

(56) References Cited

U.S. PATENT DOCUMENTS

2003/0137813 A1   7/2003   Onizuka et al.
2008/0259586 A1   10/2008  Hosokawa et al.

FOREIGN PATENT DOCUMENTS

JP   2002-093995 A   3/2002
JP   2013-206982 A   10/2013

OTHER PUBLICATIONS

Search Report for PCT/JP2017/002580, dated Apr. 4, 2017.

*Primary Examiner* — Tremesha S Willis
(74) *Attorney, Agent, or Firm* — Honigman LLP (57) ABSTRACT

A circuit structure includes a circuit substrate surface having a circuit pattern; a plurality of bus bars are fixed to another surface of the circuit substrate with an interval therebetween; an electronic component straddles an interval between two adjacent bus bars, a first terminal is electrically connected to one bus bar and a second terminal is electrically connected to the circuit pattern; and a flexible sheet member is fixed to the bus bar to insulate the bus bar and the second terminal from each other, while electrically connecting the second terminal and the circuit pattern. The flexible sheet member includes: an adhesive layer fixed to the bus bar; a terminal conductor foil piece electrically connecting the second terminal and the circuit pattern; and an insulating layer that is interposed between the adhesive layer and the
(Continued)

terminal conductor foil piece insulating the bus bar and the terminal conductor foil piece.

6 Claims, 10 Drawing Sheets

(51) Int. Cl.
*B60R 16/02* (2006.01)
*H05K 1/18* (2006.01)
(52) U.S. Cl.
CPC .............. *H05K 2201/10053* (2013.01); *H05K 2201/10166* (2013.01); *H05K 2201/10272* (2013.01)
(58) Field of Classification Search
USPC .......................................................... 361/749
See application file for complete search history.

FIG. 11

CIRCUIT STRUCTURE

CROSS-REFERENCE TO RELATED APPLICATIONS

This application is the U.S. national stage of PCT/JP2017/002580 filed Jan. 25, 2017, which claims priority of Japanese Patent Application No. 2016-013689 filed on Jan. 27, 2016, which is incorporated herein by reference in its entirety.

FIELD OF THE INVENTION

The present description relates to a circuit structure.

BACKGROUND OF THE INVENTION

Some automobiles are equipped with an electrical connection box (also called a power distributer) that distributes power from a power supply (a battery) to loads such as headlamps and wipers. A circuit structure disclosed in JP2003-164040A is an example of a member that is included in the internal circuitry of such an electrical connection box.

The circuit structure includes a control circuit substrate on which a conductive pattern (a circuit pattern) is formed, an input terminal bus bar and an output terminal bus bar that are integrated with the control circuit substrate, and a FET (Field Effect Transistor: electronic component) that is mounted on the control circuit substrate and both bus bars. The drain terminal of the FET is electrically connected to the input terminal bus bar, and the source terminal of the same is electrically connected to the output terminal bus bar. The gate terminal of the FET is folded and displaced upward relative to the source terminal, by a distance that corresponds to the thickness of the control circuit substrate, and is electrically connected to a conductive pattern on the control circuit substrate on the output terminal bus bar ([0036] to [0039] in Description, and FIG. 4).

SUMMARY OF THE INVENTION

A circuit structure according to the present disclosure is a circuit structure including: a circuit substrate that has one surface on which a circuit pattern is formed; a plurality of bus bars that constitute a power circuit and are fixed to the other surface of the circuit substrate with an interval therebetween; an electronic component that straddles an interval between two of the bus bars that are adjacent to each other, and has a first terminal that is electrically connected to one of these bus bars and a second terminal that is electrically connected to the circuit pattern of the circuit substrate; and a flexible sheet member that is fixed to the one bus bar to insulate the one bus bar and the second terminal from each other, while electrically connecting the second terminal and the circuit pattern to each other.

The flexible sheet member includes: an adhesive layer that is fixed to the one bus bar; a terminal conductor foil piece that electrically connects the second terminal and the circuit pattern to each other; and an insulating layer that is interposed between the adhesive layer and the terminal conductor foil piece and insulates the one bus bar and the terminal conductor foil piece from each other.

DETAILED DESCRIPTION OF THE PREFERRED EMBODIMENTS

A circuit structure that can be easily mounted on a circuit substrate for electronic components is desired to be developed. A difference in level that corresponds to the thickness of the circuit substrate is provided between the circuit pattern and a bus bar of the circuit substrate. According to JP2003-164040A, the source terminal and the gate terminal are displaced from each other in a vertical direction by a distance corresponding to the difference in level as described above so that the source terminal and the gate terminal can be electrically connected to the bus bar and the circuit pattern on the circuit substrate, respectively. The source terminal and the gate terminal can be separated from each other in the vertical direction by bending the gate terminal. However, such a task is troublesome. If a gate terminal has a long length, the terminal can be easily bent. However, in particular, if a gate terminal has a short length, the terminal cannot be easily bent. Thus, there is the risk of difficulty in mounting the terminal on the circuit substrate.

Therefore, one objective of the present description is to provide a circuit structure that allows an electronic component to be easily mounted on a circuit substrate.

The circuit structure according to the present disclosure allows an electronic component to be easily mounted on a circuit substrate.

First, the following lists up and describes embodiments of the present description.

(1) A circuit structure according to one aspect of the present intention is a circuit structure including: a circuit substrate that has one surface on which a circuit pattern is formed; a plurality of bus bars that constitute a power circuit and are fixed to the other surface of the circuit substrate with an interval therebetween; an electronic component that straddles an interval between two of the bus bars that are adjacent to each other, and has a first terminal that is electrically connected to one of these bus bars and a second terminal that is electrically connected to the circuit pattern of the circuit substrate; and a flexible sheet member that is fixed to the one bus bar to insulate the one bus bar and the second terminal from each other, while electrically connecting the second terminal and the circuit pattern to each other.

The flexible sheet member includes: an adhesive layer that is fixed to the one bus bar; a terminal conductor foil piece that electrically connects the second terminal and the circuit pattern to each other; and an insulating layer that is interposed between the adhesive layer and the terminal conductor foil piece and insulates the one bus bar and the terminal conductor foil piece from each other.

With the above-described configuration, it is easy to mount the electronic component on the circuit substrate. Since the flexible sheet member is provided, there is no need to directly connect the second terminal to the circuit pattern, and therefore there is no need to perform bending processing on the second terminal to bend the second terminal in view of the thickness of the circuit substrate, and three is no need to perform tasks such as bending processing. Since there is no need to bend the second terminal, it is easy to mount the electronic component on the circuit substrate even if the second terminal is short.

(2) According to another aspect of the above-described circuit structure, the insulating layer may include: a main body that overlaps the terminal conductor foil piece; and a protruding portion that is formed continuously with the main body, and protrudes from the main body toward the other of the two bus bars, without overlapping the terminal conductor foil piece.

With the above-described configuration, it is possible to increase the creepage distance between the terminal conductor foil piece and the one bus bar, and thus it is possible to improve insulation between them.

(3) According to another aspect of the above-described circuit structure, the insulating layer may include: a main body that overlaps the terminal conductor foil piece; and an extension portion that is formed continuously with the main body, and extends from the main body toward the first terminal, without overlapping the terminal conductor foil piece.

With the above-described configuration, it is possible to increase the creepage distance between the terminal conductor foil piece and the first terminal, and thus it is possible to improve insulation between the terminal conductor foil piece (the second terminal) and the first terminal.

(4) According to another aspect of the above-described circuit structure, the flexible sheet member may include a bus bar conductor foil piece that is provided on the insulating layer, electrically independent of the terminal conductor foil piece, and that electrically connects the one bus bar and the circuit pattern on the circuit substrate to each other.

With the above-described configuration, the single flexible sheet member can electrically connect the second terminal and the circuit pattern to each other, and electrically connect the one bus bar, to which the first terminal is electrically connected, and the circuit pattern to each other. That is, there is no need to separately prepare a coupling member for electrically connecting the one bus bar and the circuit pattern on the circuit substrate to each other, which leads to a reduction in the number of components.

(5) According to another aspect of the above-described circuit structure, the one bus bar may include a bus bar cutout portion that is formed in an overlapping area where the one bus bar overlaps the second terminal, and that provides a clearance between the one bus bar and the adhesive layer.

With the above-described configuration, the bus bar cutout portion can absorb thermal expansion and contraction caused by a difference between the coefficient of thermal expansion of a connection member (e.g. a solder) that connects the first terminal to the one bus bar and the coefficient of thermal expansion of the flexible sheet member. Therefore, it is possible to maintain electrical connection between the first terminal and the one bus bar over a long period of time. Details will be described in a second embodiment below.

(6) According to another aspect of the above-described circuit structure, the adhesive layer may include an adhesive layer cutout portion that is formed in an overlapping area where the adhesive layer overlaps the second terminal, and that provides a clearance between the insulating layer and the one bus bar.

With the above-described configuration, as in the above-described case where the bus bar cutout portion is provided, it is possible to maintain electrical connection between the first terminal and the one bus bar over a long period of time, due to the presence of the adhesive layer cutout portion.

The following describes details of embodiments of the present description with reference to the drawings. The same reference numerals in the drawings indicate objects that have the same name.

First Embodiment

Circuit Structure

Figure 1:
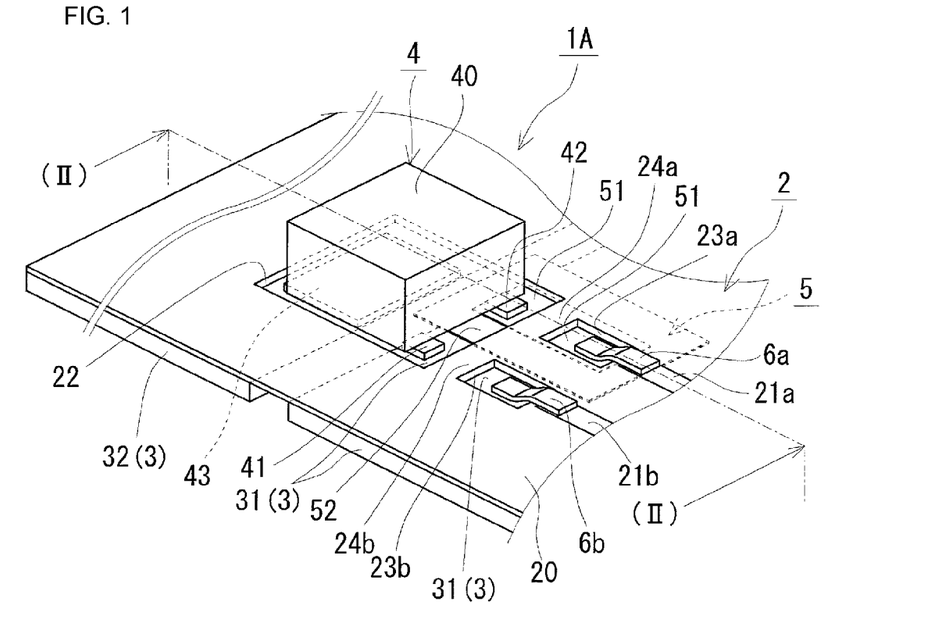
FIG. 1 is a perspective view schematically showing a circuit structure according to a first embodiment.
Figure 2:
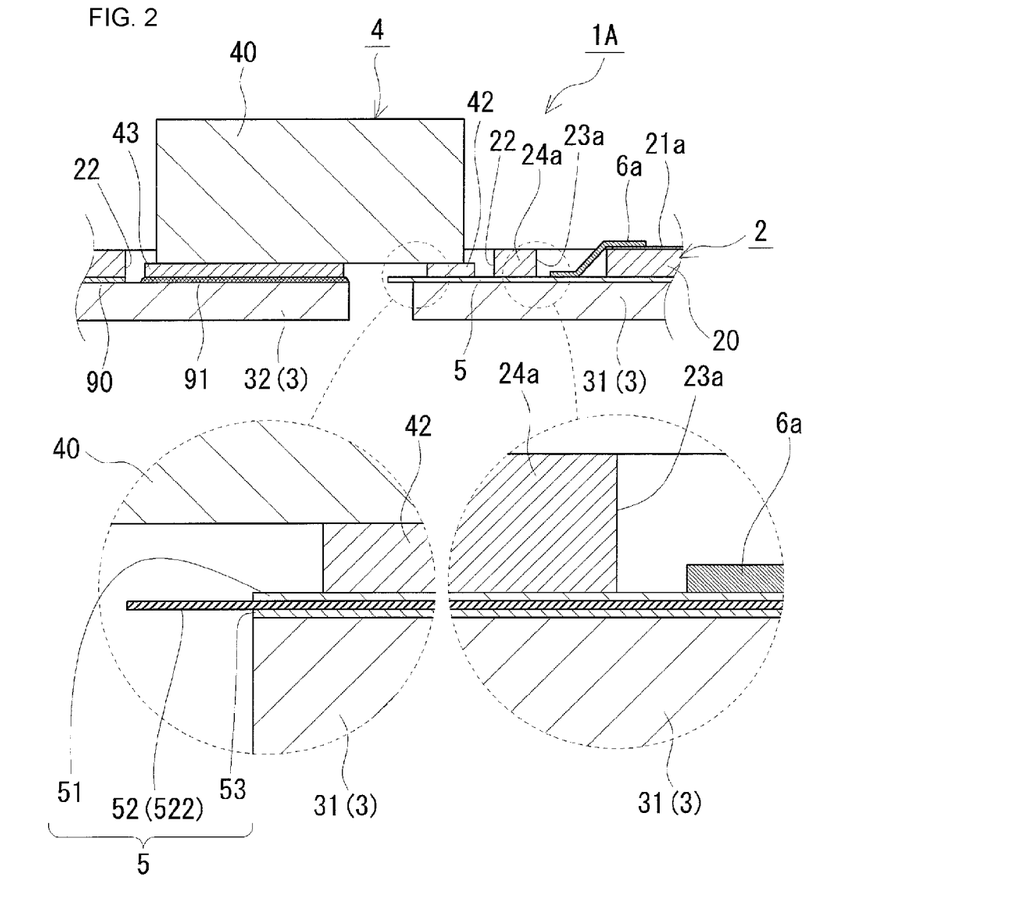
FIG. 2 is a cross sectional view of the circuit structure along a cutting line (II)-(II) in FIG. 1.
Figure 3:
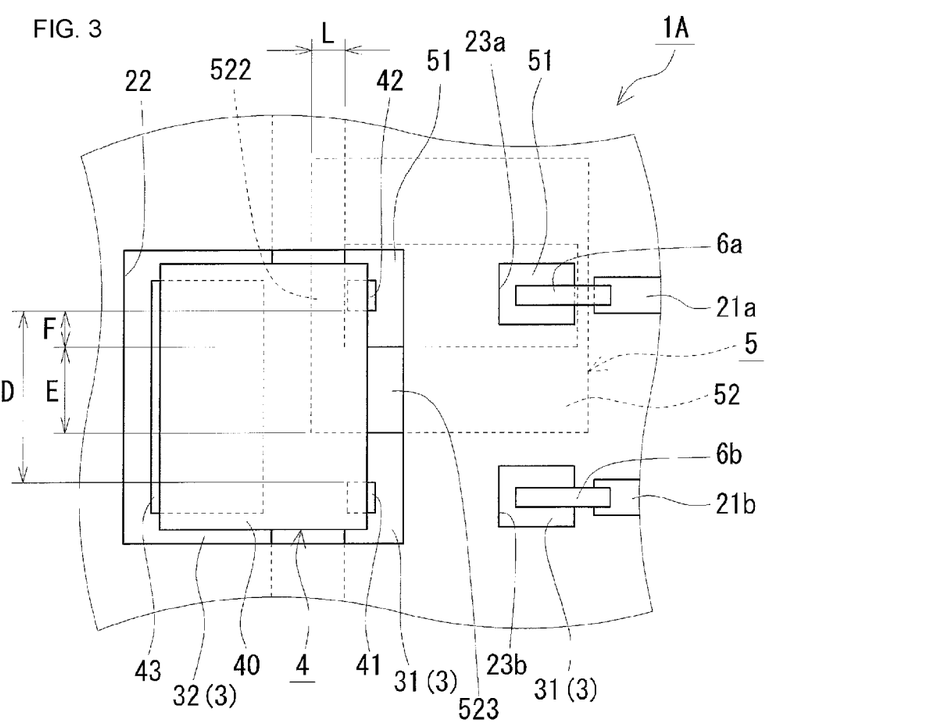
FIG. 3 is a plan view schematically showing a circuit structure according to the first embodiment.

The following describes a circuit structure 1A according to a first embodiment with reference to FIGS. 1 to 3. The circuit structure 1A includes a circuit substrate 2 that has circuit patterns 21a and 21b, a plurality of bus bars 3 that are fixed to the circuit substrate 2, and an electronic component 4 that is mounted over both the circuit substrate 2 and the bus bars 3. One feature of the circuit structure 1A is that the circuit structure 1A is configured as a specific layered structure, and is provided with a flexible sheet member 5 that electrically connects at least one of the terminals of the electronic component 4 to the circuit pattern 21a. The following describes the details. In the following description, it is defined that the circuit substrate 2 side of the circuit structure 1A is the upper side, and the bus bars 3 side of the same is the lower side.

Circuit Substrate

The circuit substrate 2 is a substrate on which the electronic component 4 is mounted. The circuit substrate 2 includes an insulating substrate 20, and circuit patterns 21a and 21b that are formed on one surface (the upper surface) of the insulating substrate 20 and to which the electronic component 4 is electrically connected. The circuit patterns 21a and 21b are formed using pieces of copper foil. A printed board may be used as the circuit substrate 2. The bus bars 3 are fixed to the other surface (the lower surface) of the insulating substrate 20. The insulating substrate 20 is provided with a mounting through hole 22 through which the electronic component 4 is mounted on the bus bars 3, and coupling through holes 23a and 23b through which the electronic component 4 and the circuit patterns 21a and 21b are electrically connected to each other. Each of the through holes 22, 23a, and 23b is rectangular. Partitions 24a and 24b that are constituted by portions of the insulating substrate 20 and separate the through hole 22 and the through holes 23a and 23b from each other are formed between the through hole 22 and the through holes 23a and 23b.

Bus Bars

The bus bars 3 constitute a power circuit. The bus bars 3 are connected to a power supply, electrical loads, and so on. There are a plurality of bus bars 3, and the plurality of bus bars 3 (31 and 32) are fixed to the other surface (the lower surface) of the circuit substrate 2 with an interval between them. Each of the bus bars 3 is plate-shaped. Examples of the material of the bus bars 3 include conductive metals, specifically copper, a copper alloy, and so on. To fix the plurality of bus bars 3 and the circuit substrate 2 to each other, an adhesive sheet 90 (FIG. 2) may be used, which is interposed between them. An example of the constituent material of the adhesive sheet 90 is a resin that is electrically insulating, and that is resistant to heat at a solder reflow temperature, which is generated when the electronic component 4 is mounted. Examples of the constituent material of the adhesive sheet 90 include an insulative adhesive that is made of an epoxy resin or the like.

Electronic Component

The electronic component 4 is mounted over both the circuit substrate 2 and the bus bars 3. The electronic component 4 includes a main body 40 that straddles an interval between two bus bars 31 and 32 that are adjacent to each other, from among the plurality of bus bars 3. The main body 40 has a first terminal 41 that is electrically and mechanically connected to one bus bar 31 out of the bus bars 31 and 32, a second terminal 42 that is electrically connected to the circuit pattern 21a, and a third terminal 43 that is electrically and mechanically connected to the other bus bar 32. A connecting metal material, typically a solder 91 (FIG. 2), may be used for such electrical and mechanical connection.

The pair of the first terminal 41 and the second terminal 42, and the third terminal 43 are arranged on opposite sides of the main body 40, and are integrated with the main body 40. That is, the first terminal 41 and the second terminal 42 are arranged side by side on the same side with respect to the main body 40 (on the one bus bar 31 side). The first terminal 41 is electrically connected to the one bus bar 31, and is thus electrically connected to the circuit pattern 21b on the circuit substrate 2. Specifically, the one bus bar 31 is electrically and mechanically connected to a coupling member 6b described below through the coupling through hole 23b, and the coupling member 6b is electrically and mechanically connected to the circuit pattern 21b. The second terminal 42 and the circuit pattern 21a are electrically connected to each other via the flexible sheet member 5 described below.

The number of terminals, namely the first terminal 41 to the third terminal 43, may be changed to one or two or more, depending on the type of the electronic component 4. Examples of the electronic component 4 include a switching element such as a relay or a FET (Field Effect Transistor).

In this example, a FET is employed as the electronic component 4, and the first terminal 41 is configured as the source terminal, the second terminal 42 is configured as the gate terminal, and the third terminal 43 is configured as the drain terminal. Although there may be two or more first terminals 41 (source terminals) and two or more third terminals 43 (drain terminals), the drawing shows only one of each for the purpose of illustration.

Flexible Sheet Member

The flexible sheet member 5 insulates the one bus bar 31 and the second terminal 42 from each other, while electrically connecting the second terminal 42 and the circuit pattern 21a to each other. The flexible sheet member 5 is fixed to the upper surface of the one bus bar 31. The flexible sheet member 5 is flat and extends along the upper surface of the one bus bar 31.

The thickness of the flexible sheet member 5 is sufficiently smaller than the thickness of the circuit substrate 2, and the flexible sheet member 5 is flexible. Since the flexible sheet member 5 is sufficiently thin, the difference in level in the vertical direction can be reduced at the first terminal 41 and the second terminal 42. Such a difference in level can be substantially eliminated. If such a difference in level is not provided, there is no need to perform processing to bend the second terminal 42, and therefore it is easy to mount the electronic component 4 on the circuit substrate 2. In particular, even if the terminals are short, it is easy to mount the electronic component 4 on the circuit substrate 2.

The thickness of the flexible sheet member 5 does not have an influence on the bonding of the circuit substrate 2 and the bus bars 3 to each other. Therefore, the flexible sheet member 5 is configured to be thinner than the adhesive sheet 90 located between the circuit substrate 2 and the bus bars 3. The thickness of the flexible sheet member 5 is preferably no greater than 150 μm, for example. If the thickness of the flexible sheet member 5 is no greater than 150 μm, the flexible sheet member 5 is not excessively thick, and is likely to be thinner than the adhesive sheet 90. Also, there is no need to provide a difference in level in the vertical direction between the first terminal 41 and the second terminal 42, and there is no need to perform bending processing or the like on the second terminal 42. For example, if the thickness of the adhesive sheet 90 is 85 μm, the thickness of the flexible sheet member 5 is preferably no greater than 75 μm. For example, the thickness of the flexible sheet member 5 may be no less than 55 μm. If the thickness of the flexible sheet member 5 is no less than 55 μm, it is easy to form a terminal conductor foil piece 51, an insulating layer 52, and an adhesive layer 53 described below such that they each have a predetermined thickness, and it is easy to ensure their respective functions of electrical connection, electrical insulation, and bonding.

An FPC (Flexible Printed Circuit) may be employed as the flexible sheet member 5. The flexible sheet member 5 includes the terminal conductor foil piece 51, the insulating layer 52, and the adhesive layer 53 (FIG. 2). The terminal conductor foil piece 51, the insulating layer 52, and the adhesive layer 53 are integrated into one piece. Note that the adhesive layer 53 in the flexible sheet member 5 may be separately formed on the bus bar 31 without being integrated with the terminal conductor foil piece 51 or the insulating layer 52 into one piece. If this is the case, the total of the thickness of terminal conductor foil piece 51 and the thickness of the insulating layer 52 is preferably no less than 24 μm.

Terminal Conductor Foil Piece

The terminal conductor foil piece 51 electrically connects the second terminal 42 and the circuit pattern 21a to each other. One end of the terminal conductor foil piece 51 is electrically and mechanically connected to the second terminal 42. The other end of the terminal conductor foil piece 51 is electrically and mechanically connected to a coupling member 6a described below through the coupling through hole 23a. The terminal conductor foil piece 51 is electrically connected to the circuit pattern 21a via the coupling member 6a. The terminal conductor foil piece 51 may be formed using a piece of copper foil. A solder (not shown) may be used for such electrical and mechanical connection.

The terminal conductor foil piece 51 is rectangular. The width of the terminal conductor foil piece 51 is preferably larger than the width of the second terminal 42. With such a configuration, it is easy to connect the second terminal 42 to the terminal conductor foil piece 51. The widths mentioned above refer to those in the direction in which the first terminal 41 and the second terminal 42 are arranged side by side. The length of the terminal conductor foil piece 51 in the direction in which the bus bars 31 and 32 are arranged side by side spans from the other bus bar 32-side edge (hereinafter, "the facing edge") of the one bus bar 31 to the coupling through hole 23a. That is, the other end of the terminal conductor foil piece 51 is exposed from the coupling through hole 23a. The thickness of the terminal conductor foil piece 51 is preferably no less than 10 μm. If the thickness of the terminal conductor foil piece 51 is no less than 10 μm, it is easier to ensure electrical connection to the second terminal 42 and the circuit pattern 21a. The thickness of the terminal conductor foil piece 51 is preferably no greater than 70 μm. Furthermore, the thickness of the terminal conductor foil piece 51 is preferably no less than 12 μm and no greater than 35 μm.

Insulating Layer

The insulating layer 52 insulates the one bus bar 31 and the terminal conductor foil piece 51 from each other. The insulating layer 52 is interposed between the terminal conductor foil piece 51 and the adhesive layer 53. An example of the constituent material of the insulating layer 52 is a resin that is resistant to heat at a solder reflow temperature, which is generated when the electronic component 4 is mounted. Examples of the constituent material of the insulating layer 52 include a polyimide resin. The thickness of the insulating layer 52 is preferably no less than 10 μm. If the thickness of the insulating layer 52 is no less than 10 μm, it is easier to ensure electrical insulation between the one bus bar 31 and the terminal conductor foil piece 51. The thickness of the insulating layer 52 is preferably no greater than 50 μm. Furthermore, the thickness of the insulating layer 52 is preferably no less than 12 μm and no greater than 30 μm.

Main Body

As shown in the lower drawing in FIG. 3, the insulating layer 52 includes a main body 521 that overlaps the terminal conductor foil piece 51. The main body 521 and the terminal conductor foil piece 51 overlap each other along their entire lengths. That is, the main body 521 has the same rectangular shape as the terminal conductor foil piece 51, and its dimensions (the width and the length) are the same as those of the terminal conductor foil piece 51. It is possible to integrate the terminal conductor foil piece 51 and the insulating layer 52 into one piece by bonding the terminal conductor foil piece 51 and the main body 521 to each other using an adhesive. It is preferable that at least one of a protruding portion 522 and an extension portion 523 is formed continuously with the main body 521, and it is particularly preferable that both of them are formed continuously with the main body 521.

Protruding Portion

The protruding portion 522 increases the creepage distance between the terminal conductor foil piece 51 and the one bus bar 31. Thus, it is possible to improve insulation between the terminal conductor foil piece 51 and the one bus bar 31. The protruding portion 522 protrudes from the main body 521 toward the other bus bar 32. That is, the protruding portion 522 does not overlap the terminal conductor foil piece 51, and is exposed from the terminal conductor foil piece 51.

It is possible to increase the creepage distance by increasing a protruding length L of the protruding portion 522 (the upper drawing in FIG. 3). The protruding length L of the protruding portion 522 may be set so as not to come into contact with the other bus bar 32 (the left enlarged view in FIG. 2).

Extension Portion

The extension portion 523 increases the creepage distance to the first terminal 41. Thus, it is possible to improve insulation between the terminal conductor foil piece 51 and the first terminal 41. The extension portion 523 extends from the main body 521 toward the first terminal 41 that is adjacent to the extension portion 523. That is, as with the protruding portion 522, the extension portion 523 does not overlap the terminal conductor foil piece 51, and is exposed from the terminal conductor foil piece 51.

As in the case of the protruding length L of the protruding portion 522, it is possible to increase the creepage distance by increasing a length E of the extension portion 523 (the upper drawing in FIG. 3). Preferably, a total length E+F, which is the total of the length E of the extension portion 523 and a length F from the second terminal 42 to the first terminal 41 side end of the terminal conductor foil piece 51, satisfies $\frac{1}{2} \times D \leq E+F < D$, for example, where D indicates the length between the first terminal 41 and the second terminal 42. Since the aforementioned total length E+F is no less than $\frac{1}{2} \times D$, it is easier to improve the aforementioned insulation. Since the aforementioned total length E+F is less than D, it is possible to prevent the insulating layer 52 and the first terminal 41 from interfering with each other, and to connect the first terminal 41 and the one bus bar 31 to each other.

Adhesive Layer

The adhesive layer 53 fixes the insulating layer 52 to the one bus bar 31 (FIG. 2). As a result, the flexible sheet member 5 is fixed to the one bus bar 31. Substantially the entire areas of the adhesive layer 53 and the insulating layer 52 overlap each other. For example, if the insulating layer 52 is provided with the protruding portion 522, the adhesive layer 53 may be provided on the lower surface of the protruding portion 522, or may not be provided. The shape of the adhesive layer 53 may be the same as the shape of the insulating layer 52 (rectangular in this example), and the dimensions (the width and the length) of the adhesive layer 53 may be substantially the same as the dimensions of the insulating layer 52. Examples of the constituent material of the adhesive layer 53 include an insulative adhesive that is made of an acrylic resin, a silicone resin, or the like in addition to the resin used in the above-described adhesive sheet 90. The thickness of the adhesive layer 53 is preferably no less than 25 μm. If the thickness of the adhesive layer 53 is no less than 25 μm, it is easier to ensure adhesion between the insulating layer 52 and the one bus bar 31. The thickness of the adhesive layer 53 is preferably no greater than 50 μm.

Coupling Members

The coupling members 6a and 6b couple the flexible sheet member 5 and the one bus bar 31 to the circuit patterns 21a and 21b, to electrically connect the second terminal 42 and the first terminal 41 to the circuit patterns 21a and 21b. Each of the coupling members 6a and 6b is constituted by a bent piece that is bent so that a difference in level that is substantially equal to the thickness of the circuit substrate 2 is provided between one end portion and the other end portion of each of the coupling members 6a and 6b. One end portion of the coupling member 6a is electrically and mechanically connected to the terminal conductor foil piece 51 in the coupling through hole 23a, and the other end portion is electrically and mechanically connected to the circuit pattern 21a on the insulating substrate 20. One end portion of the coupling member 6b is electrically and mechanically connected to the one bus bar 31 in the coupling through hole 23b, and the other end portion is electrically and mechanically connected to the circuit pattern 21b on the insulating substrate 20. A solder (not shown) may be used for such electrical and mechanical connection. Examples of the material of the coupling members 6a and 6b include conductive metals such as copper and a copper alloy.

Applications

The circuit structure 1A according to the first embodiment can be advantageously used as an electrical connection box for an automobile.

Operative Effect

The circuit structure 1A according to the first embodiment is provided with the flexible sheet member 5 that electrically connects the second terminal 42 and the circuit pattern 21a on the circuit substrate 2 on the one bus bar 31. Therefore, when electrically connecting the second terminal 42 and the circuit pattern 21a to each other, there is no need to directly connect the second terminal 42 to the circuit pattern 21a. Thus, there is no need to perform bending processing or the like on the second terminal 42 to bend the second terminal 42 to separate the first terminal 41 and the second terminal 42, which are to be connected to the one bus bar 31, from each other in the vertical direction, in view of the thickness of the circuit substrate 2. Therefore, it is easy to mount the electronic component 4 on the circuit substrate 2. In particular, since there is no need to bend the second terminal 42, it is easy to mount the electronic component 4 on the circuit substrate 2 even if the terminals 41 to 43 of the electronic component 4 are short.

Second Embodiment

Circuit Structure

Figure 4:
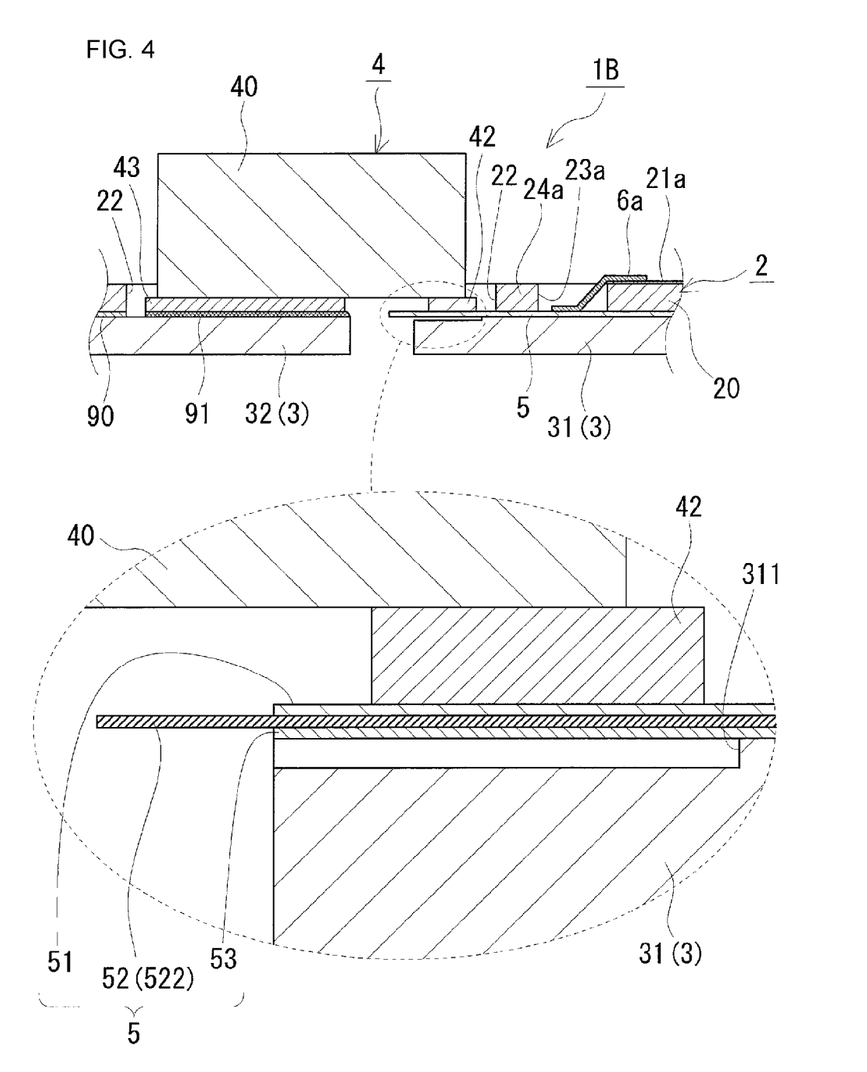
FIG. 4 is a cross-sectional view schematically showing a circuit structure according to a second embodiment.
Figure 5:
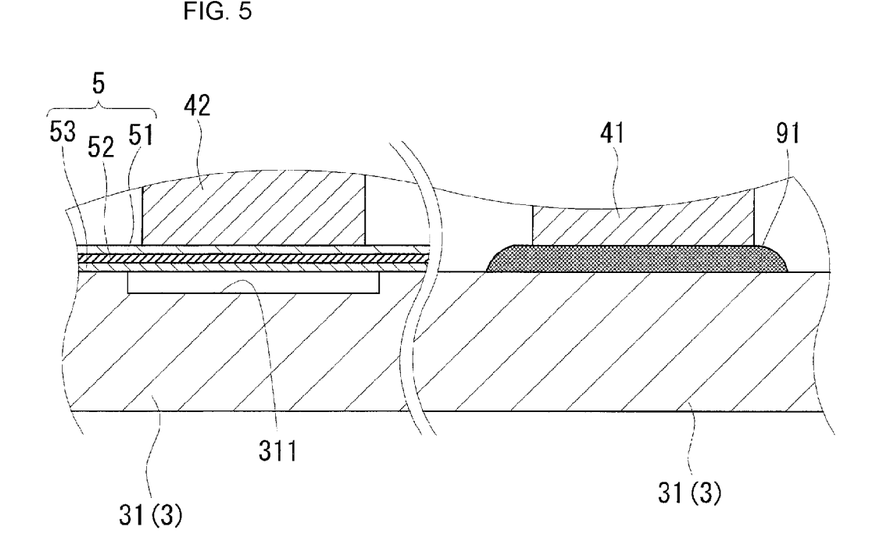
FIG. 5 is a partially enlarged view of areas in the vicinity of a first terminal and a second terminal that are provided on the circuit structure according to the second embodiment, seen from another bus bar side.

The following describes a circuit structure 1B according to a second embodiment with reference to FIGS. 4 and 5. The circuit structure 1B is different from the circuit structure 1A according to the first embodiment in that the one bus bar 31 includes a bus bar cutout portion 311. The circuit structure 1B is otherwise the same as the circuit structure 1A according to the first embodiment. The following mainly describes the difference, and descriptions of the same configurations and the same effects are omitted. The same applies to third to fifth embodiments below. Note that FIG. 5 shows areas in the vicinity of the first terminal 41 and the second terminal 42 seen from the other bus bar 32 side, and hatching is applied to each member for the purpose of illustration. The same applies to FIG. 7 which is referenced in a third embodiment.

Bus Bars

Bus Bar Cutout Portion

The bus bar cutout portion 311 is formed in the one bus bar 31 in an area that overlaps the second terminal 42 so that a clearance is formed between the one bus bar 31 and the adhesive layer 53. Such a configuration reduces a load that is applied to the first terminal 41 due to a difference between displacements of the first terminal 41 and the second terminal 42 caused by changes in the temperature of the circuit structure 1B during the use. Therefore, it is possible to prevent the solder 91, which connects the first terminal 41 to the one bus bar 31, from being damaged, such as becoming cracked.

A connecting metal material, typically the solder 91 or the like, is used for electrical connection between the first terminal 41 and the one bus bar 31. The solder 91, and the flexible sheet member 5, which is electrically connected to the second terminal 42, expand and contract due to changes in the temperature of the circuit structure 1B during the use. Typically, the coefficient of thermal expansion of the flexible sheet member 5 (specifically, the insulating layer 52) is larger than the coefficient of thermal expansion of the solder 91, and accordingly the displacement of the flexible sheet member 5 due to expansion is larger than the displacement of the solder 91. Since the first terminal 41 and the second terminal 42 are both connected to the main body 40, if the one bus bar 31 does not include the bus bar cutout portion 311, a load will be applied to the solder 91 on the first terminal 41 side, which is displaced by a small amount, due to the flexible sheet member 5 being displaced by a large amount. Due to this load, the solder 91 may be damaged, e.g. cracked. In contrast, since the one bus bar 31 includes the bus bar cutout portion 311, when the flexible sheet member 5 expands, the flexible sheet member 5 can be let into the clearance provided by the bus bar cutout portion 311. Thus, the clearance can absorb the difference between the displacements of the flexible sheet member 5 and the solder 91, and prevent a load from being applied to the solder 91 due to the displacement of the flexible sheet member 5.

As shown in FIGS. 4 and 5, a formation area where the bus bar cutout portion 311 is formed is larger than an area that overlaps the second terminal 42. In this example, as shown in FIG. 4, the formation area, which extends in the direction in which the bus bars 31 and 32 are arranged side by side, is an area that is on the upper surface side of the bus bar 31 and spans from the facing edge, which faces the other bus bar 32, to a position that is closer to the partition 24a than the second terminal 42 is. That is, the facing edge, which faces the other bus bar 32, of the bus bar cutout portion 311 is open. As shown in FIG. 5, the width of the formation area, which extends in the direction in which the terminals 41 and 42 are arranged side by side, is larger than the width of the second terminal 42.

The bus bar cutout portion 311 may be formed by cutting out a portion that overlaps the second terminal 42, of the one bus bar 31, along the entire length in the vertical direction (the thickness direction). That is, the one bus bar 31 is not necessarily present below the second terminal 42. Also, the bus bar cutout portion 311 may be configured as a recess or a through hole that is enclosed so that the above-described facing edge of the one bus bar 31 is not open.

Operative Effect

With the circuit structure 1B according to the second embodiment, it is possible to prevent the solder 91 that connects the first terminal 41 and the one bus bar 31 to each other, from, for example, becoming cracked due to changes in the temperature during the use. Therefore, it is possible to maintain electrical connection between the first terminal 41 and the one bus bar 31 over a long period of time.

Third Embodiment

Circuit Structure

Figure 6:
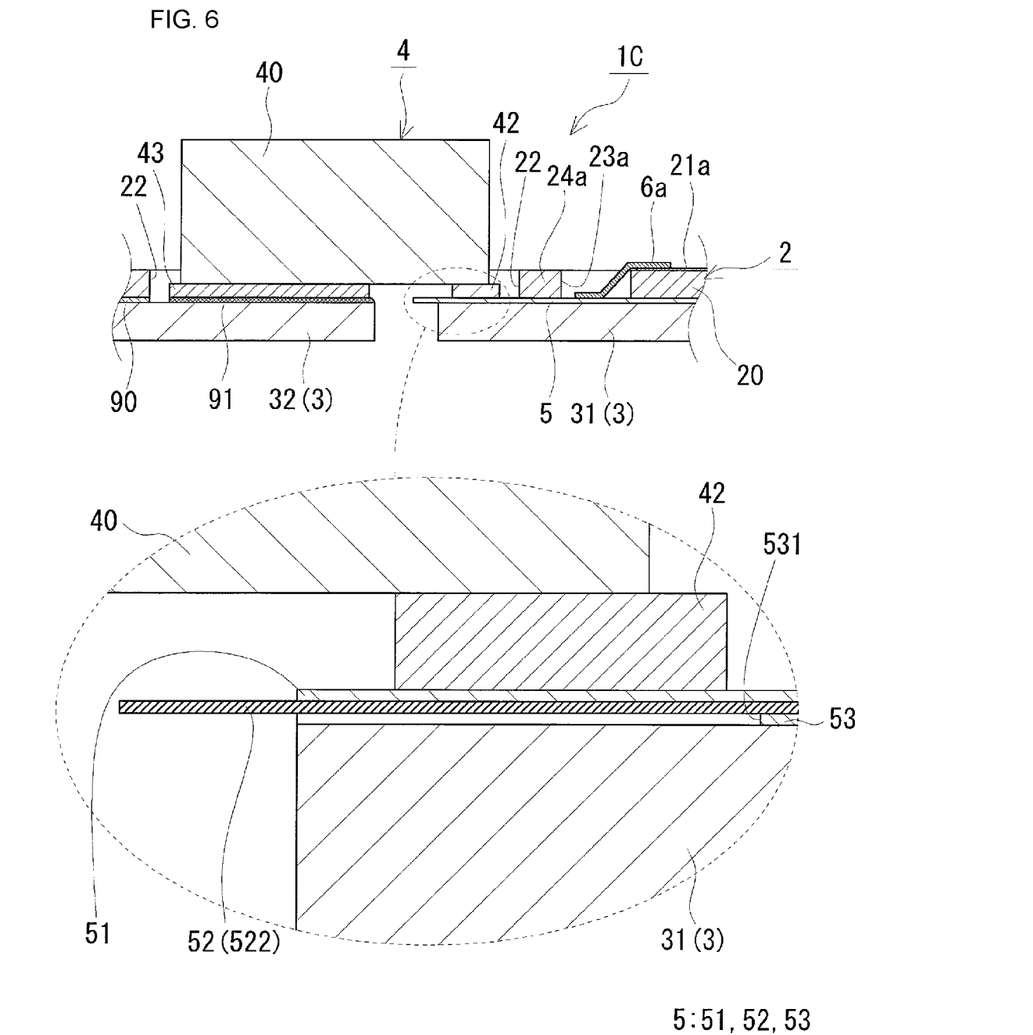
FIG. 6 is a cross-sectional view schematically showing a circuit structure according to a third embodiment.
Figure 7:
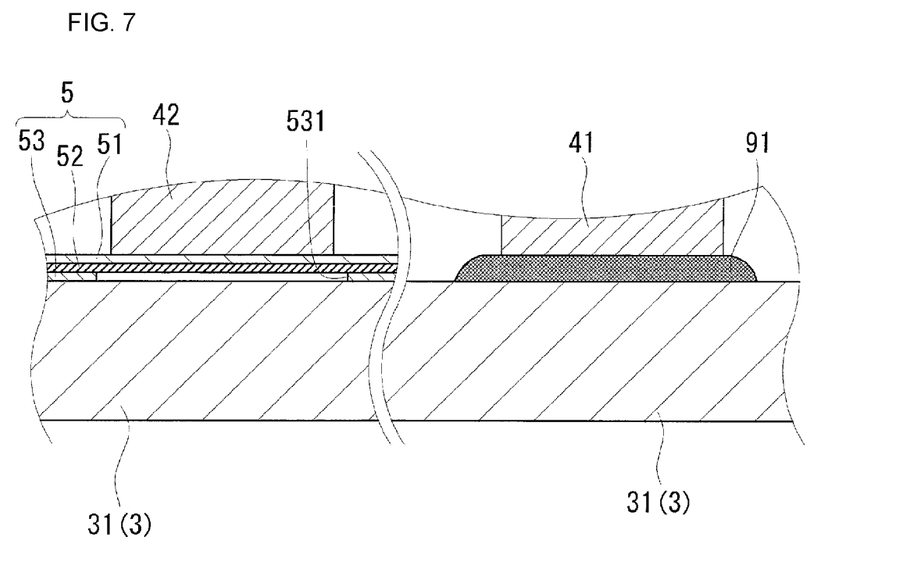
FIG. 7 is a partially enlarged view of areas in the vicinity of a first terminal and a second terminal that are provided on the circuit structure according to the third embodiment, seen from another bus bar side.

The following describes a circuit structure 1C according to a third embodiment with reference to FIGS. 6 and 7. The circuit structure 1C is different from the circuit structure 1A according to the first embodiment in that the adhesive layer 53 includes an adhesive layer cutout portion 531. The circuit structure 1C is otherwise the same as the circuit structure 1A according to the first embodiment.

Adhesive Layer

Adhesive Layer Cutout Portion

The adhesive layer cutout portion 531 is formed in the adhesive layer 53 in an area that overlaps the second terminal 42 so that a clearance is formed between the adhesive layer 53 and the one bus bar 31. As with the bus bar cutout portion 311 according to the second embodiment, such a configuration reduces a load that is applied to the first terminal 41 due to a difference between displacements of the first terminal 41 and the second terminal 42 caused by changes in the temperature of the circuit structure 1C during the use. Therefore, as in the case where the bus bar cutout portion 311 according to the second embodiment is provided, it is possible to prevent the solder 91, which connects the first terminal 41 to the one bus bar 31, from being damaged, such as becoming cracked.

As shown in FIGS. 6 and 7, a formation area where the adhesive layer cutout portion 531 is formed is larger than an area that overlaps the second terminal 42. In this example, as shown in FIG. 6, the formation area, where the adhesive layer cutout portion 531 is formed and which extends in the direction in which the bus bars 31 and 32 are arranged side by side, is an area that spans from a facing edge, which faces the other bus bar 32, to a position that is closer to the partition 24a than the second terminal 42 is. That is, the facing edge, which faces the other bus bar 32, of the adhesive layer cutout portion 531 is open. As shown in FIG. 7, the width of the formation area, which extends in the direction in which the terminals 41 and 42 are arranged side by side, is larger than the width of the second terminal 42. The adhesive layer cutout portion 531 may be configured as a through hole that is enclosed so that the above-described facing edge of the adhesive layer 53 is not open.

Operative Effect

With the circuit structure 1C according to the third embodiment, as in the second embodiment, it is possible to prevent the solder 91 that connects the first terminal 41 to the one bus bar 31 from being damaged such as becoming cracked.

Fourth Embodiment

Circuit Structure

Figure 8:
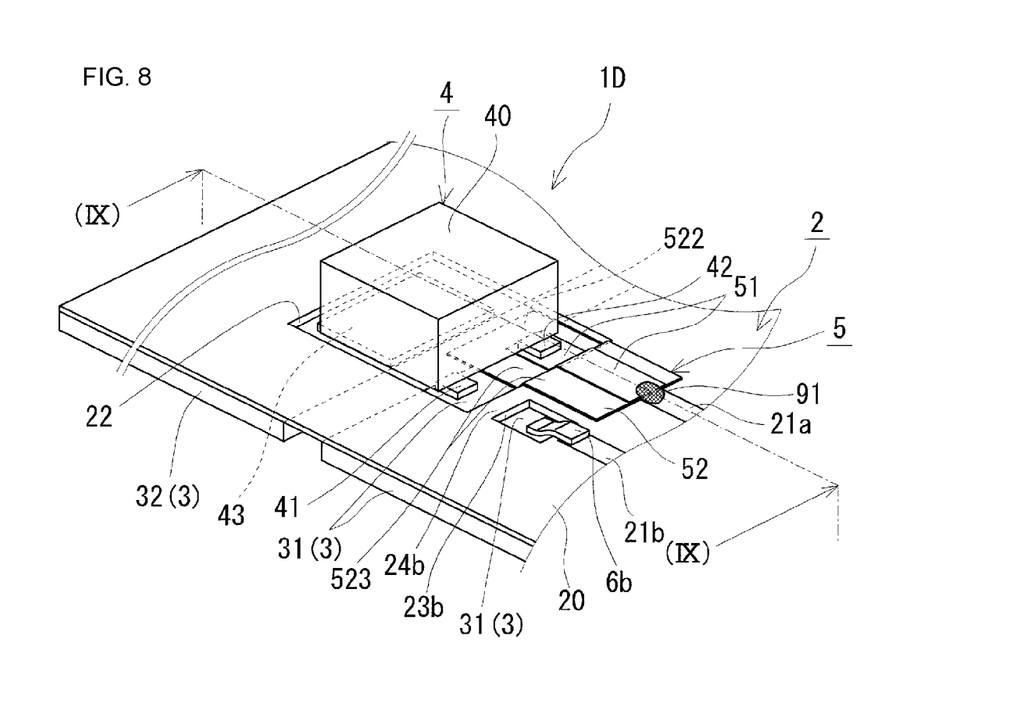
FIG. 8 is a perspective view schematically showing a circuit structure according to a fourth embodiment.
Figure 9:
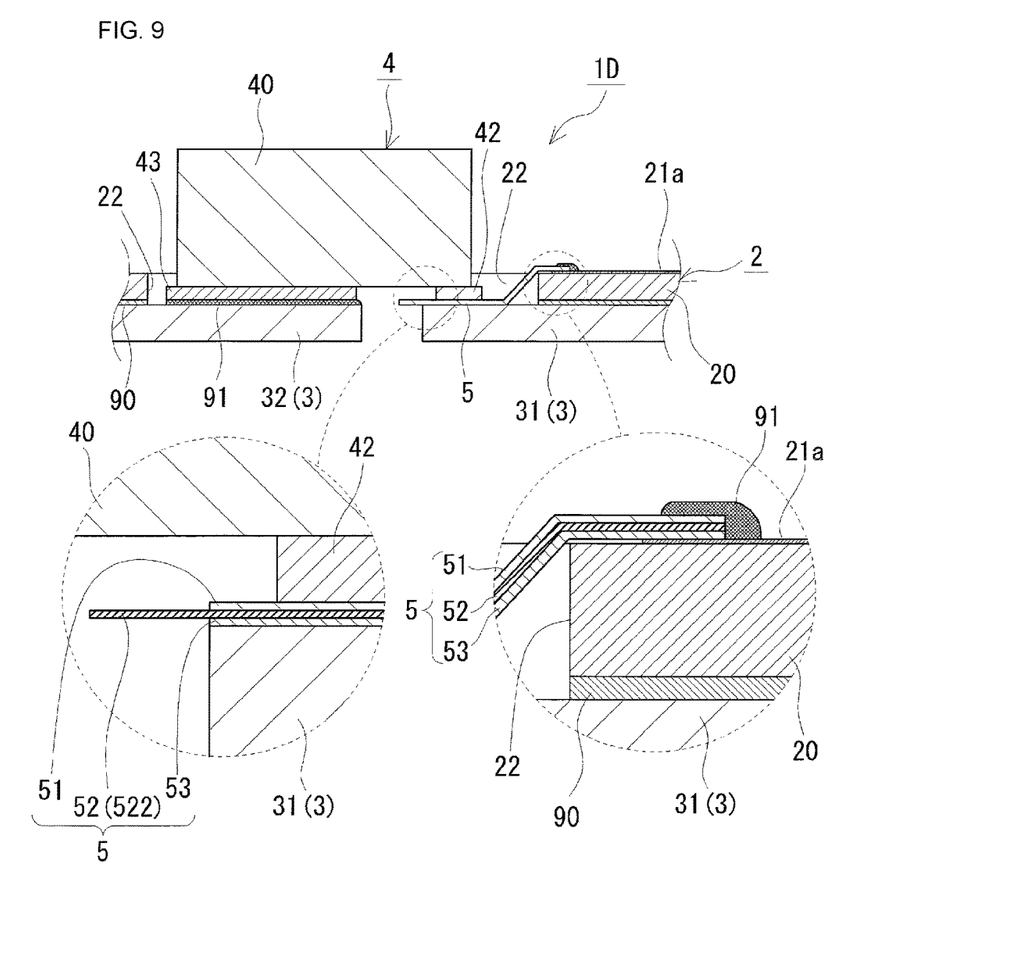
FIG. 9 is a cross sectional view of the circuit structure along a cutting line (IX)-(IX) in FIG. 8.

The following describes a circuit structure 1D according to a fourth embodiment with reference to FIGS. 8 and 9. The circuit structure 1D is different from the circuit structure 1A according to the first embodiment mainly in that the second terminal 42 and the circuit pattern 21a are electrically connected to each other using the flexible sheet member 5, without using the coupling member 6a (FIG. 1). In this example, as shown in FIG. 8, the circuit substrate 2 is not provided with the coupling through hole 23a and the partition 24a described above (see FIG. 1 for both).

Flexible Sheet Member

The flexible sheet member 5 is bent in the middle and has an S-like shape so that a difference in level that corresponds to the thickness of the circuit substrate 2 is provided between one end portion and the other end portion of the flexible sheet member 5. The flexible sheet member 5 is flexible and can be easily bent. One end portion of the flexible sheet member 5 is electrically and mechanically connected to the second terminal 42, and the other end portion is electrically and mechanically connected to the circuit pattern 21a on the insulating substrate 20. The solder 91 may be used for such electrical and mechanical connection. FIGS. 8 and 9 only show the solder 91 that connects the other end portion of the flexible sheet member 5 and the circuit pattern 21a to each other, and a solder that connects the one end portion of the flexible sheet member 5 and the second terminal 42 to each other is omitted from the figures.

Operative Effect

With the circuit structure 1D according to the fourth embodiment, it is possible to use the flexible sheet member 5 to electrically connect the second terminal 42 to the circuit pattern 21a. Therefore, it is possible to omit the coupling member 6a according to the first embodiment (see FIG. 1) for electrically connecting the flexible sheet member 5 and the circuit pattern 21a to each other. Thus, the circuit structure 1D according to the fourth embodiment requires a reduced number of components compared to the circuit structure 1A according to the first embodiment.

Fifth Embodiment

Circuit Structure

Figure 10:
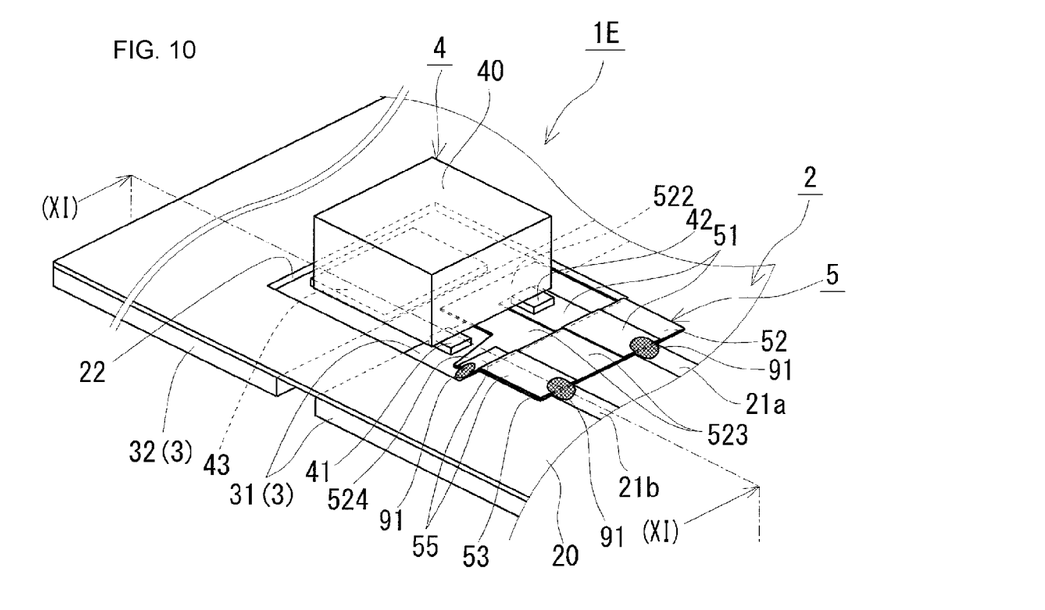
FIG. 10 is a perspective view schematically showing a circuit structure according to a fifth embodiment.
Figure 11:
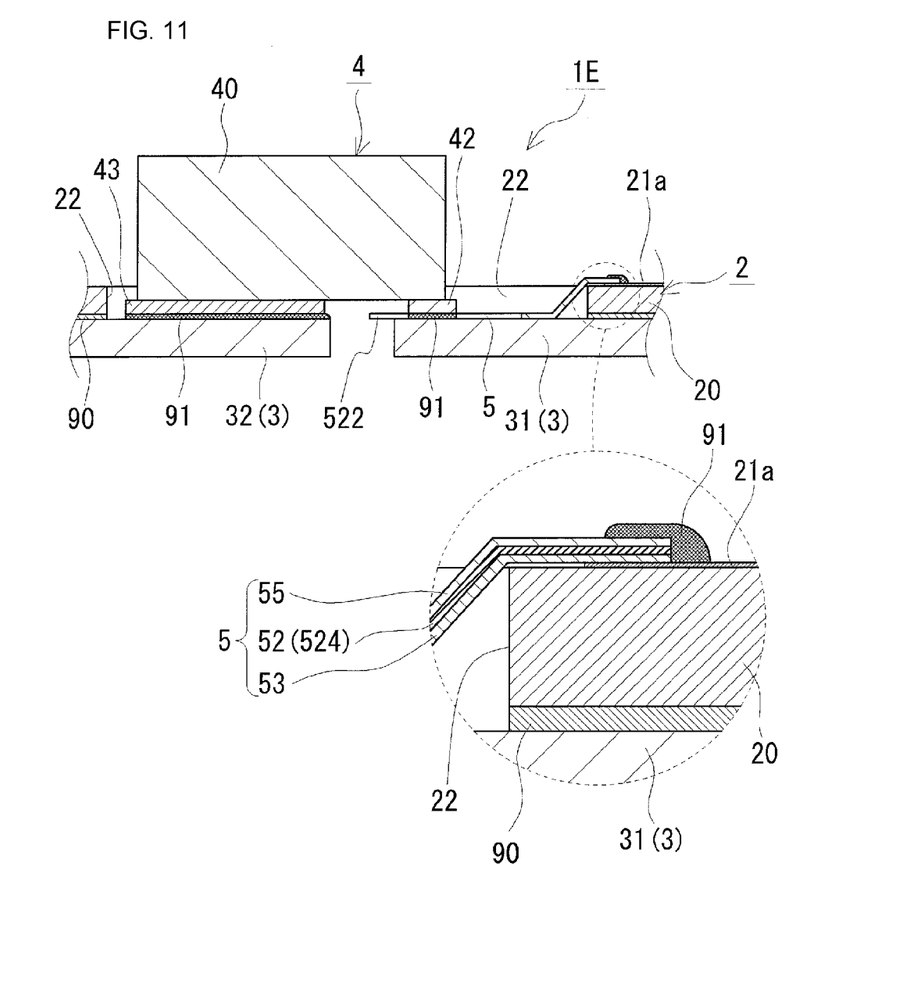
FIG. 11 is a cross sectional view of the circuit structure along a cutting line (XI)-(XI) in FIG. 10.

The following describes a circuit structure 1E according to a fifth embodiment with reference to FIGS. 10 and 11. The circuit structure 1E is different from the circuit structure 1D according to the fourth embodiment mainly in that the flexible sheet member 5 is provided with a bus bar conductor foil piece 55 that electrically connects the one bus bar 31 and the circuit pattern 21b to each other. In this example, as shown in FIG. 10, the circuit substrate 2 is not provided with the coupling through holes 23a and 23b and the partitions 24a and 24b described above (see FIG. 1 for both).

Flexible Sheet Member

The flexible sheet member 5 further includes the bus bar conductor foil piece 55 in addition to the terminal conductor foil piece 51, the insulating layer 52, and the adhesive layer 53. The terminal conductor foil piece 51 is the same as the one described above.

Insulating Layer

Expansion Portion

The insulating layer 52 further includes an expansion portion 524 in addition to the main body 521, the protruding portion 522, and the extension portion 523 described above. The expansion portion 524 is interposed between the one bus bar 31 and the bus bar conductor foil piece 55. The expansion portion 524 is formed continuously with the extension portion 523, does not overlap the terminal conductor foil piece 51 or first terminal 41, extends from the extension portion 523, in a direction away from the main body 521 (the terminal conductor foil piece 51), and overlaps the bus bar conductor foil piece 55. The adhesive layer 53 that fixes the expansion portion 524 to the one bus bar 31 is interposed between the expansion portion 524 and the one bus bar 31 (FIG. 11).

Bus Bar Conductor Foil Piece

The bus bar conductor foil piece 55 electrically connects the first terminal 41 and the circuit pattern 21b via the one bus bar 31. The bus bar conductor foil piece 55 is provided on the insulating layer 52 (the expansion portion 524), electrically independent of the terminal conductor foil piece 51. One end of the bus bar conductor foil piece 55 is electrically and mechanically connected to the one bus bar 31. The other end of the bus bar conductor foil piece 55 is electrically and mechanically connected to the circuit pattern 21b. A solder 91 is used for such electrical and mechanical connection.

The shape of the bus bar conductor foil piece 55 may be selected as appropriate depending on the path from the one bus bar 31 to the circuit pattern 21b. In this example, a rectangular shape is selected. The width of the bus bar conductor foil piece 55 may be selected as appropriate in view of heat generated by a current passing therethrough, workability of connection using a solder 91, the creepage distance of the extension portion 523, and so on. In this example, the bus bar conductor foil piece 55 has the same width as the terminal conductor foil piece 51, and is provided in parallel with the terminal conductor foil piece 51 with an interval therebetween that substantially corresponds to the interval between the circuit patterns 21a and 21b. As with the terminal conductor foil piece 51, the bus bar conductor foil piece 55 may be formed using a piece of copper foil.

Operative Effect

With the circuit structure 1E according to the fifth embodiment, the single flexible sheet member 5 can electrically connect the second terminal 42 and the circuit pattern 21a to each other, and electrically connect the one bus bar 31, to which the first terminal 41 is electrically connected, and the circuit pattern 21b to each other. Therefore, it is possible to omit the coupling member 6b according to the first embodiment (see FIG. 1) for electrically connecting the one bus bar 31 and the circuit pattern 21b to each other, as well as the coupling member 6a according to the first embodiment for electrically connecting the flexible sheet member 5 and the circuit pattern 21a to each other. Thus, the circuit structure 1E according to the fifth embodiment requires a reduced number of components compared to the circuit structure 1A according to the first embodiment, and furthermore, compared to the circuit structure 1D according to the fourth embodiment.

The present description is not limited to the examples, and is specified by the scope of claims. All changes that come within the meaning and range of equivalency of the claims are intended to be embraced therein. For example, a circuit structure that is provided with both a bus bar cutout portion and an adhesive layer cutout portion may be realized.

LIST OF REFERENCE NUMERALS 1A, 1B, 1C, 1D, 1E: Circuit Structure
2: Circuit Substrate
20: Insulating Substrate
21a, 21b: Circuit Pattern
22: Mounting Through Hole
23a, 23b: Coupling Through Hole
24a, 24b: Partition
3: Bus Bar
31: One Bus Bar
311: Bus Bar Cutout Portion
32: The Other Bus Bar
4: Electronic Component
40: Main Body
41: First Terminal
42: Second Terminal
43: Third Terminal
5: Flexible Sheet Member
51: Terminal Conductor Foil Piece
52: Insulating Layer
521: Main Body
522: Protruding Portion
523: Extension Portion
524: Expansion Portion
53: Adhesive Layer
531: Adhesive Layer Cutout Portion
55: Bus Bar Conductor Foil Piece
6a, 6b: Coupling Member
90: Adhesive Sheet
91: Solder

The invention claimed is:

1. A circuit structure comprising:
a circuit substrate that has one surface on which a circuit pattern is formed;
a plurality of bus bars that constitute a power circuit and are fixed to the other surface of the circuit substrate with an interval therebetween;
an electronic component that straddles an interval between two of the bus bars that are adjacent to each other, and has a first terminal that is electrically connected to one of these bus bars and a second terminal that is electrically connected to the circuit pattern of the circuit substrate; and
a flexible sheet member that is fixed to the one bus bar to insulate the one bus bar and the second terminal from each other, while electrically connecting the second terminal and the circuit pattern to each other,
wherein the flexible sheet member includes:
an adhesive layer that is fixed to the one bus bar;
a terminal conductor foil piece that electrically connects the second terminal and the circuit pattern to each other; and
an insulating layer that is interposed between the adhesive layer and the terminal conductor foil piece and insulates the one bus bar and the terminal conductor foil piece from each other.

2. The circuit structure according to claim 1,
wherein the insulating layer includes:
a main body that overlaps the terminal conductor foil piece; and
a protruding portion that is formed continuously with the main body, and protrudes from the main body toward the other of the two bus bars, without overlapping the terminal conductor foil piece.

3. The circuit structure according to claim 1,
wherein the insulating layer includes:
a main body that overlaps the terminal conductor foil piece; and
an extension portion that is formed continuously with the main body, and extends from the main body toward the first terminal, without overlapping the terminal conductor foil piece.

4. The circuit structure according to claim 1,
wherein the flexible sheet member includes a bus bar conductor foil piece that is provided on the insulating layer, electrically independent of the terminal conductor foil piece, and that electrically connects the one bus bar and the circuit pattern on the circuit substrate to each other.

5. The circuit structure according to claim 1,
wherein the one bus bar includes a bus bar cutout portion that is formed in an overlapping area where the one bus bar overlaps the second terminal, and that provides a clearance between the one bus bar and the adhesive layer.

6. The circuit structure according to claim 1,
wherein the adhesive layer includes an adhesive layer cutout portion that is formed in an overlapping area where the adhesive layer overlaps the second terminal, and that provides a clearance between the insulating layer and the one bus bar.

* * * * *